United States Patent
Keller et al.

(10) Patent No.: US 7,062,727 B2
(45) Date of Patent: Jun. 13, 2006

(54) COMPUTER AIDED DESIGN SYSTEMS AND METHODS WITH REDUCED MEMORY UTILIZATION

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 231 days.

(21) Appl. No.: 10/647,598

(22) Filed: Aug. 25, 2003

(65) Prior Publication Data

US 2005/0050484 A1 Mar. 3, 2005

(51) Int. Cl.
*G06F 17/50* (2006.01)

(52) U.S. Cl. .............. 716/1; 716/2; 711/133
(58) Field of Classification Search .............. 716/1–2; 711/133, 136, 141, 147, 152, 154, 159–160, 711/163
See application file for complete search history.

(56) References Cited

U.S. PATENT DOCUMENTS

| | | | |
|---|---|---|---|
| 4,654,819 A * | 3/1987 | Stiffler et al. .............. 711/162 |
| 5,249,133 A | 9/1993 | Batra | |
| 5,301,318 A | 4/1994 | Mittal | |
| 5,668,732 A | 9/1997 | Khouja et al. | |
| 5,673,420 A | 9/1997 | Reyes et al. | |
| 5,682,320 A | 10/1997 | Khouja et al. | |
| 5,696,694 A | 12/1997 | Khouja et al. | |
| 5,812,416 A | 9/1998 | Gupte et al. | |
| 5,825,660 A | 10/1998 | Cagan et al. | |
| 5,831,869 A | 11/1998 | Ellis et al. | |
| 5,838,579 A | 11/1998 | Olson et al. | |
| 5,903,476 A | 5/1999 | Mauskar et al. | |
| 5,946,218 A | 8/1999 | Taylor et al. | |
| 5,949,691 A | 9/1999 | Kurosaka et al. | |
| 6,028,991 A | 2/2000 | Akashi | |
| 6,075,932 A | 6/2000 | Khouja et al. | |
| 6,185,722 B1 | 2/2001 | Darden | |
| 6,230,299 B1 | 5/2001 | McSherry et al. | |
| 6,256,711 B1 * | 7/2001 | Berliner .............. 711/135 |

(Continued)

FOREIGN PATENT DOCUMENTS

JP 07334532 A 12/1995

OTHER PUBLICATIONS

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; Filed Nov. 12, 2003.

(Continued)

*Primary Examiner*—Stacy A. Whitmore

(57) ABSTRACT

Methods, systems, software products analyze a circuit design with reduced memory utilization. Access to at least one block of the circuit design is detected. If the one block is not loaded within a circuit model of computer memory, a determination is made whether loading the one block into the circuit model would exceed a predefined maximum utilization of the computer memory. If loading the one block into the circuit model would exceed the predefined maximum utilization, one or more blocks from the circuit model are unloaded and the one block is loaded into the circuit model. If loading the one block into the circuit model would not exceed the predefined maximum utilization, the one block is loaded into the circuit model.

22 Claims, 8 Drawing Sheets

U.S. PATENT DOCUMENTS

| | | |
|---|---|---|
| 6,272,671 B1 | 8/2001 | Fakhry |
| 6,308,301 B1 | 10/2001 | McBride et al. |
| 6,308,304 B1 | 10/2001 | Devgan et al. |
| 6,330,703 B1 | 12/2001 | Saito et al. |
| 6,345,379 B1 | 2/2002 | Khouja et al. |
| 6,363,516 B1 | 3/2002 | Cano et al. |
| 6,378,123 B1 | 4/2002 | Dupenloup |
| 6,480,987 B1 | 11/2002 | McBride |
| 6,490,717 B1 | 12/2002 | Pederson et al. |
| 6,493,864 B1 | 12/2002 | Liu |
| 6,523,149 B1 | 2/2003 | Mehrotra et al. |
| 6,526,562 B1 | 2/2003 | Haddad et al. |
| 6,529,861 B1 | 3/2003 | Patra et al. |
| 6,531,923 B1 | 3/2003 | Burns |
| 6,587,999 B1 | 7/2003 | Chen et al. |
| 6,598,211 B1 | 7/2003 | Zachariah et al. |
| 6,618,834 B1 * | 9/2003 | Takeyama et al. ............. 716/2 |
| 6,751,782 B1 | 6/2004 | Levin et al. |
| 6,772,404 B1 | 8/2004 | Tanaka |
| 6,801,884 B1 | 10/2004 | Ferreri et al. |
| 6,807,520 B1 | 10/2004 | Zhou et al. |
| 6,836,877 B1 | 12/2004 | Dupenloup |
| 6,931,613 B1 | 8/2005 | Kauth et al. |
| 2002/0002701 A1 | 1/2002 | Usami et al. |
| 2002/0010901 A1 | 1/2002 | Otaguro |
| 2002/0023255 A1 | 2/2002 | Kamiewicz |
| 2002/0144219 A1 | 10/2002 | Zachariah et al. |
| 2003/0051222 A1 | 3/2003 | Williams et al. |
| 2003/0200519 A1 | 10/2003 | Argyres |
| 2003/0208721 A1 | 11/2003 | Regnier |
| 2003/0221173 A1 | 11/2003 | Fisher |
| 2003/0237067 A1 | 12/2003 | Mielke et al. |
| 2004/0044972 A1 | 3/2004 | Rohrbaugh et al. |
| 2004/0078767 A1 | 4/2004 | Burks et al. |
| 2004/0199880 A1 | 10/2004 | Kresh et al. |
| 2005/0027954 A1 * | 2/2005 | Rothman et al. ........... 711/159 |

OTHER PUBLICATIONS

Keller, S. Brandon; Rogers, Dennis R.; Lelm, Charles A.; U.S. Appl. No. 10/706,698, Entitled: Method and Program Product For Performing Self-Heating Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; Filed Nov. 12, 2003.

Keller, S. Brandon; Rogers, Dennis R.; Lelm, Charles A.; U.S. Appl. No. 10/706,501, Entitled: Method And Program Product For Performing Electromigration Analysis In A Digital Integrated Circuit By Converting A Netlist To A DC Model And Performing DC Analysis Of The DC Model; Filed Nov. 12, 2003.

Keller, S. Brandon; Rogers, Dennis R.; Lelm, Charles A.; U.S. Appl. No. 10/706,526, Entitled: Method And Program Product For Performing A Worst Case Electromigration And Self Heating Analysis In A Digital Integrated Circuit With Worst-Case Superposition Of Partial Currents; Filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,508, Entitled: Method And Program Product For Performing Self-Heating Analysis In A Digital Integrated Circuit Layout Database by Substituting Resistive Models For Active Devices; Filed Nov. 12, 2003.

Keller, S. Brandon; Rogers, Dennis R.; Robberts, George H.; U.S. Patent Application filed under EV210655516US; Entitled: Method And Program Product For Determining Worst Case Currents In A Digital Integrated Circuit Through Worst-Case Superposition Of Partial Currents; Filed Jan. 30, 2004.

Keller, S. Brandon; Rogers, Dennis R.; Robberts, George H.; U.S. Patent Application filed under EV210655564US; Entitled: Systems And Methods For Re-Using Circuit Design Analysis Results; Filed Jan. 30, 2004.

Keller, S. Brandon; Rogers, Dennis R.; Robberts, George H.; U.S. Patent Application filed under EV210655581US; Entitled: System And Method For Determining Detail Of Analysis In A Circuit Design; Filed Jan. 30, 2004.

Keller, S. Brandon; Rogers, Dennis R.; Robberts, George H.; U.S. Patent Application filed under EV210655595US; Entitled: Systems And Methods That Identify Equivalent Instantiation-Specific Configuration Information For Analysis Tools; Filed Jan. 30, 2004.

Keller, S. Brandon; Rogers, Dennis R.; Robberts, George H. & Stevens, Scott Alan; U.S. Patent Application filed under EV210655520US; Entitled: System And Method To Limit Analyzed Current Flow In A Circuit Design; Filed Jan. 30, 2004.

Keller, S. Brandon; Rogers, Dennis R.; Robberts, George H.; U.S. Patent Application filed under EV210655533US; Entitled: System And Method For Processing Configuration Information; Filed Jan. 30, 2004.

Keller, S. Brandon; Rogers, Dennis R.; Robberts, George H.; U.S. Patent Application filed under EV210655555US; Entitled: System And Method For Balancing Run-Time And Result Accuracy In A Circuit Design Analysis Tool; Filed Jan. 30, 2004.

Keller, S. Brandon; Rogers, Dennis R.; Robberts, George H.; U.S. Patent Application filed under EV210655578US; Entitled: System And Method For Indicating Logic State Combinations Used During Circuit Design Analysis; Filed Jan. 30, 2004.

Keller, S. Brandon; Rogers, Dennis R.; Robberts, George H.; U.S. Patent Application filed under EV210655547US; Entitled: System And Method For Determining Control Signal Combinations For Use During Simulation Of A Stage Of A Circuit Design; Filed Jan. 30, 2004.

* cited by examiner

FIG 3
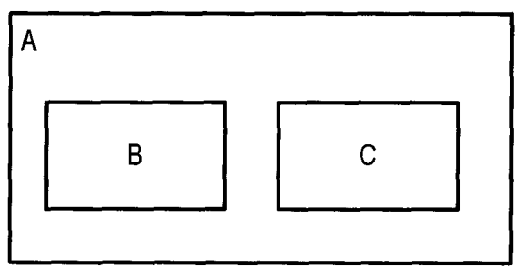
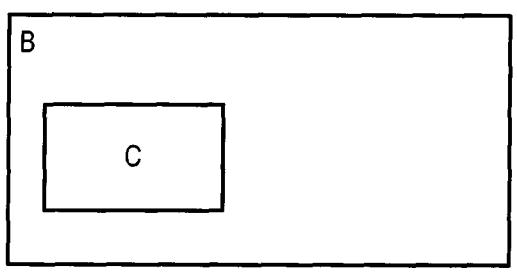
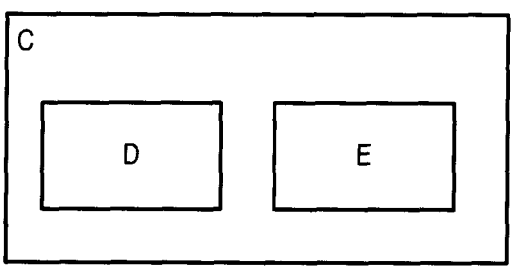
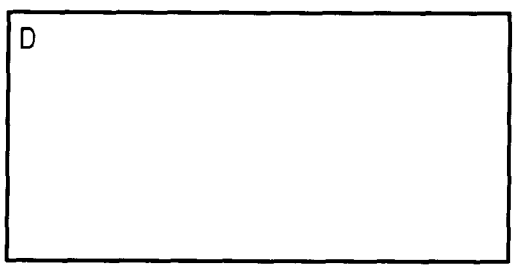
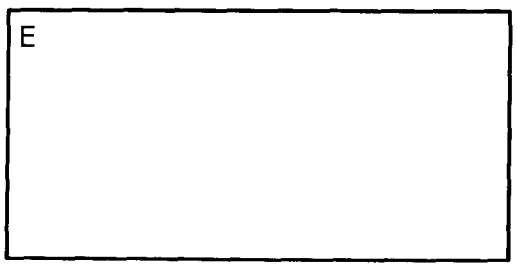

FIG 6
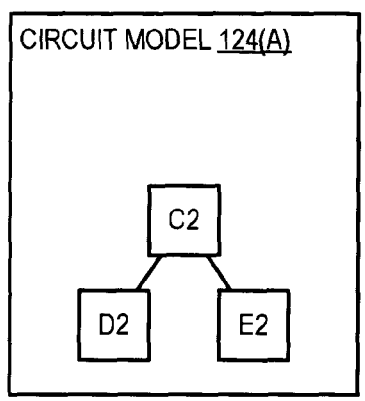
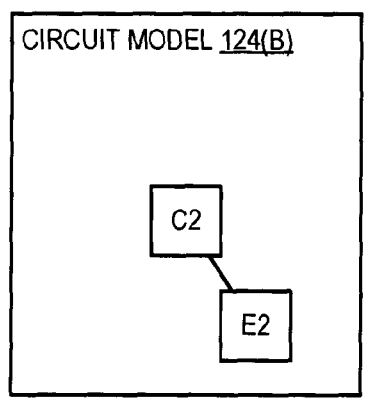
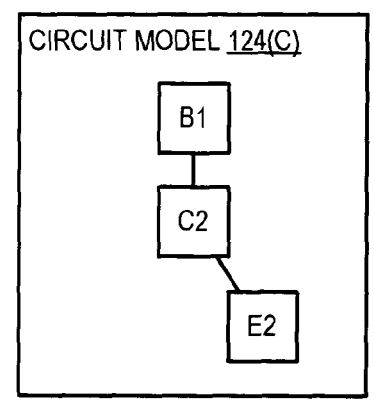

COMPUTER AIDED DESIGN SYSTEMS AND METHODS WITH REDUCED MEMORY UTILIZATION

RELATED APPLICATIONS

The present document contains material related to the material of copending, cofiled, U.S. patent application Ser No. 10/647,597, entitled System And Method For Determining Wire Capacitance For A VLSI Circuit; Ser. No. 10/647,595 entitled System And Method For Determining Applicable Configuration Information For Use In Analysis Of A Computer Aided Design; Ser. No. 10/647,687 entitled Systems And Methods Utilizing Fast Analysis Information During Detailed Analysis Of A Circuit Design; Ser. No. 10/647,594 entitled Systems And Methods For Determining Activity Factors Of A Circuit Design; Ser. No. 10/647,768 entitled System And Method For Determining A Highest Level Signal Name In A Hierarchical VLSI Design; Ser. No 10/647,606 entitled System And Method For Determining Connectivity Of Nets In A Hierarchical Circuit Design; Ser. No. 10/647,596 entitled System And Method Analyzing Design Elements In Computer Aided Design Tools; Ser. No. 10/647,608 entitled System And Method For Determining Unmatched Design Elements In A Computer-Automated Design; Ser. No. 10/647,688 entitled System And Method For Iteratively Traversing A Hierarchical Circuit Design; Ser. No. 10/647,769 entitled Systems And Methods For Establishing Data Model Consistency Of Computer Aided Design Tools; Ser. No. 10/647,607 entitled Systems And Methods For Identifying Data Sources Associated With A Circuit Design; and Ser. No. 10/647,605 entitled Systems And Methods For Performing Circuit Analysis On A Circuit Design, the disclosures of which are hereby incorporated herein by reference.

BACKGROUND

An electronic computer aided design ("E-CAD") package is utilized to construct a Very Large Scale Integration ("VLSI") circuit design. The VLSI circuit design consists of a netlist that identifies electronic design elements (e.g., capacitors, transistors, resistors, etc.) and their interconnectivity (e.g., signal nets) within the VLSI circuit design. The VLSI circuit design is constructed from hierarchical design blocks (also known as cells) that provide specific functionality to the VLSI circuit design. Such design blocks may be re-used within the VLSI circuit design, or within other circuit designs. Designs blocks may be constructed from electronic design elements, nets and other design blocks, and may be re-used one or more times. Each use of a design block is called an "instance."

A design engineer uses the E-CAD tool to analyze the VLSI circuit design during development. The E-CAD tool typically traces through instances of blocks used in the VLSI circuit design to sum certain information (e.g., field-effect transistor ("FET") width, wire capacitance, FET capacitance, etc.). During this analysis, the E-CAD tool typically loads the entire VLSI circuit design into memory. If the VLSI circuit design has billions of design elements, the circuit design uses large amounts of this memory. In certain situations, processing the circuit design becomes limited by the amount of available memory, restricting development and slowing production. Continuous lost productivity due to lengthy engineering development slows technology advancement and can result in significant costs, as well as lost business.

SUMMARY OF THE INVENTION

In one embodiment, a method analyzes a circuit design with reduced memory utilization. Access to at least one block of the circuit design is detected. If the one block is not loaded within a circuit model of computer memory, a determination is made whether loading the one block into the circuit model would exceed a predefined maximum utilization of the computer memory. If loading the one block into the circuit model would exceed the predefined maximum utilization, one or more blocks from the circuit model are unloaded and the one block is loaded into the circuit model. If loading the one block into the circuit model would not exceed the predefined maximum utilization, the one block is loaded into the circuit model.

In another embodiment, a system analyzes a circuit design with reduced memory utilization. A computer memory stores a circuit model of the circuit design. An analysis tool analyzes the circuit design by accessing one or more blocks of the circuit model. A model manager (a) loads one or more blocks of the circuit design to the circuit model and (b) unloads one or more blocks from the circuit model such that the circuit model does not exceed a predefined maximum utilization of the computer memory.

In another embodiment, a system analyzes a circuit design with reduced memory utilization, including: means for detecting access to at least one block of the circuit design; means for determining whether loading the one block into a circuit model, stored within computer memory, would exceed a predefined maximum utilization of the computer memory when the one block is not currently within the circuit model; means for unloading one or more blocks from the circuit model and loading the one block into the circuit model when loading the one block into computer memory would exceed the predefined maximum utilization; and means for loading the one block into the circuit model when loading the one block into the computer model would not exceed the predefined maximum utilization.

In one embodiment, a software product has instructions, stored on computer-readable media, wherein the instructions, when executed by a computer, perform steps for analyzing a circuit design with reduced memory utilization, including:
  instructions for detecting access to at least one block of the circuit design; instructions for recording the access when the one block is loaded within a circuit model of computer memory; instructions for determining whether loading the one block into the circuit model would exceed a predefined maximum utilization of the computer memory, when the one block is not loaded within the circuit model; instructions for unloading one or more blocks from the circuit model and loading the one block into the circuit model, when loading the one block into the circuit model would exceed the predefined maximum utilization; and instructions for loading the one block into the circuit model, when loading the one block into the circuit model would not exceed the predefined maximum utilization.

BRIEF DESCRIPTION OF THE FIGURES

FIG. 3 is an exemplary schematic diagram illustrating five design blocks.

FIG. 6 shows three chronological snapshots of a model manager.

DETAILED DESCRIPTION OF THE FIGURES

A signal net is a single electrical path in a circuit design that has the same electrical characteristics at all of its points. Any collection of wires that carries the same signal between design elements is a signal net. If the design elements allow the signal to pass through unaltered (as in the case of a terminal), then the signal net continues on subsequently connected wires. If, however, the design element modifies the signal (as in the case of a transistor or logic gate), then the signal net terminates at that design element and a new signal net begins on the other side. Connectivity in a circuit design is typically specified using a netlist, which indicates the specific nets that interconnect the various design elements.

A signal net may be divided into signal net 'pieces', each of which is part of a Highest Level Signal Name ("HLSN"). A HLSN is the unique signal name that identifies a collection of signal nets or 'hierarchical signal net pieces', which are the small pieces of intervening wire (signal nets) in each hierarchical design block of a circuit design.

A significant characteristic of VLSI and other types of circuit design is a reliance on hierarchical description. A primary reason for using hierarchical description is to hide the vast amount of detail in a design. By reducing the distracting detail to a single object that is lower in the hierarchy, one can greatly simplify many E-CAD operations. For example, simulation, verification, design-rule checking, and layout constraints can all benefit from hierarchical representation, which makes them more computationally tractable. Since many circuit designs are too complicated to be easily considered in their totality, a complete design is often viewed as a collection of design element aggregates that are further divided into sub-aggregates in a recursive and hierarchical manner. In VLSI circuit design, these aggregates are commonly referred to as design blocks (or cells). The use of a design block at a given level of hierarchy is called an 'instance'. Each design block has one or more 'ports', each of which provides a connection point between a signal net within the design block and a signal net eternal to the design block.

Figure 1:
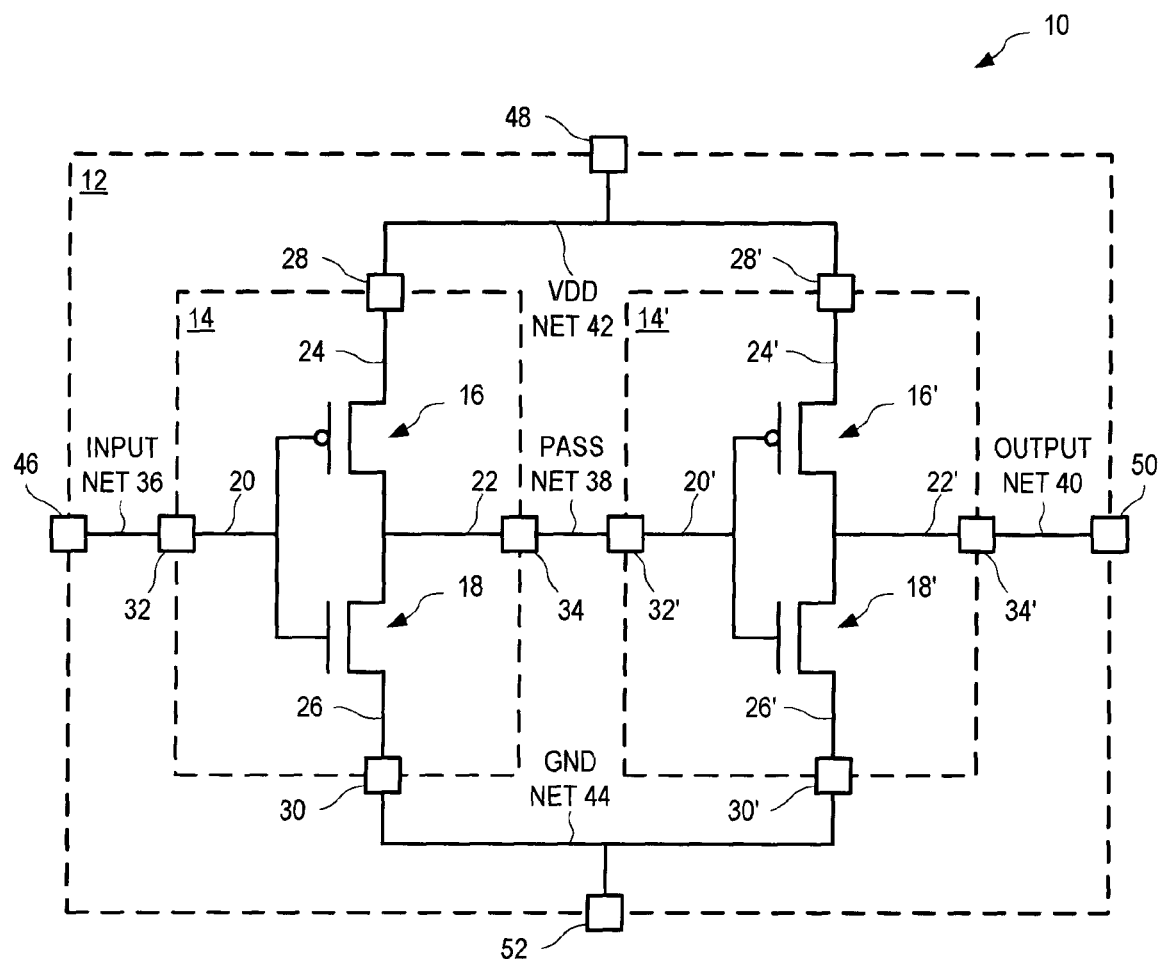
FIG. 1 shows an exemplary schematic diagram of one hierarchical circuit design.

FIG. 1 illustratively shows one hierarchical circuit design 10. Circuit design 10 has a block instance 12 that includes two block instances 14 and 14' of a design block. Block instance 14 has four ports 28, 30, 32 and 34 and, in this example, includes a p-type field-effect transistor ("FET") 16 and an n-type FET 18 connected to form an inverter. Block instance 14 also has four signal nets: 20, 22, 24 and 26: signal net 20 connects to port 32; signal net 22 connects to port 34; signal net 24 connects to port 28; and signal net 26 connects to port 30. Block instance 14' is similarly shown with FETs 16' and 18', signal nets 20', 22', 24', and 26', and ports 28', 30', 32', and 34'.

To illustrate exemplary nomenclature used in analyzing block instance 12, block instance 12 is shown with five signal nets: input net 36, pass net 38, output net 40, VDD net 42 and GND net 44. Signal nets 20 and 36 connect to port 32, forming hierarchical signal net pieces identified by HLSN "input net". Signal nets 22, 38 and 20' interconnect by ports 34 and 32' and form hierarchical signal net pieces identified by HLSN "pass net". Signal nets 24, 42 and 24' interconnect by ports 28 and 28' and form hierarchical signal net pieces identified by HLSN "VDD net". Signal nets 26, 44 and 26' interconnect by ports 30 and 30' and form hierarchical signal net pieces identified by HLSN "GND net". Signal nets 22' and 40 connect to port 34' and form hierarchical signal net pieces identified by HLSN "output net". Block instance 12 further includes ports 46, 48, 50 and 52 that connect internal signal nets 36, 42, 40 and 44 to signal nets external to block instance 12.

Figure 2:
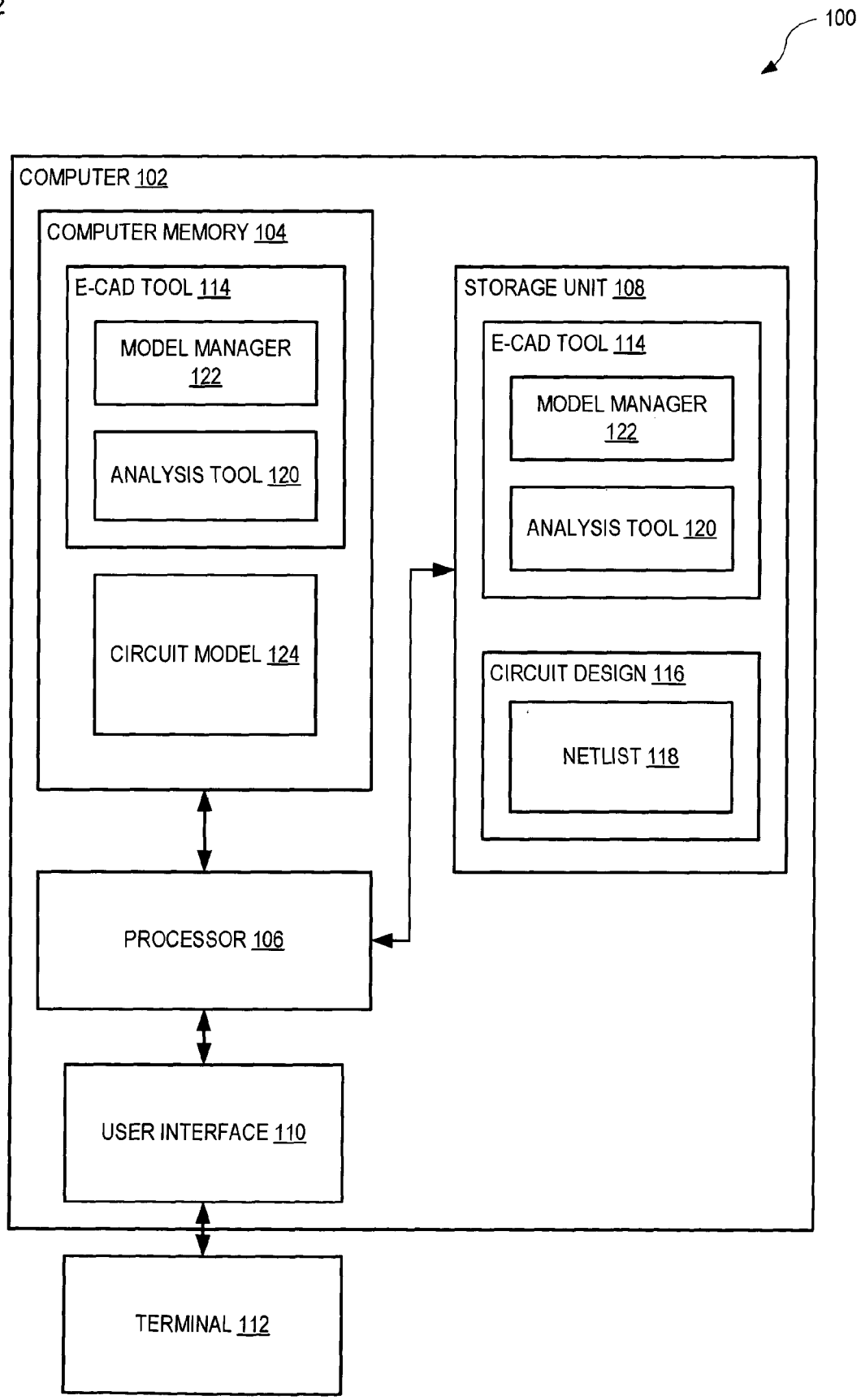
FIG. 2 is a block diagram illustrating one computer aided design system with reduced memory utilization.

FIG. 2 is a block diagram illustrating one computer aided design system 100 with reduced memory utilization. System 100 has a computer 102 with a computer memory 104, a processor 106, a storage unit 108 and a user interface 110. Storage unit 108 may for example be a disk drive for storing programs and data of computer 102. Storage unit 108 is illustratively shown storing an E-CAD tool 114, an analysis tool 120, and a circuit design 116. Circuit design 116 is, for example, a circuit design created by E-CAD tool 114. Circuit design 116 includes a netlist 118 that defines signal nets interconnecting various design elements of circuit design 116. E-CAD tool 114 includes a model manager 122 operable to reduce memory utilization of E-CAD tool 114 by partially loading circuit design 116 into a circuit model 124 for analysis tool 120.

More particularly, processor 106 loads E-CAD tool 114, including model manager 122 and analysis tool 120, from storage unit 108 into computer memory 104 such that E-CAD tool 114 and model manager 122 are executable by processor 106. Once loaded into computer memory 104, a design engineer operates E-CAD tool 114 to process and analyze circuit design 116. During analysis of circuit design 116 by analysis tool 120, model manager 122 operates to reduce memory utilization by analysis tool 120; model manager 122 loads blocks of circuit design 116 into circuit model 124 (within computer memory 104), as required by analysis tool 120, and unloads blocks from computer memory 104 to storage unit 103 when unnecessary to analysis tool 120.

In illustrative operation, user interface 110 connects to a terminal 112 (e.g., a keyboard), external to computer 102. Through terminal 112 and user interface 110, the design engineer interacts with E-CAD tool 114 and analysis tool 120. In one example, the design engineer instructs E-CAD tool 114 to analyze circuit design 116 using analysis tool 120. Model manager 122 in turn manages which blocks are present within computer memory 104 when analysis tool 120 analyzes circuit design 116.

An exemplary circuit design 116' is shown and described in connection with FIG. 3 and FIG. 4. Specifically, FIG. 3 shows five design blocks A, B, C, D and E of a hierarchical circuit design 116', which may for example represent circuit design 116 of FIG. 1. Similar to block 12, FIG. 1, which includes block instances 14 and 14', design block A includes design blocks B and C; design block B includes design block C; and design block C includes design blocks D and E. Design blocks D and E do not include other design blocks. Design elements are not shown within design blocks A, B, C, D and E of the example for clarity of illustration. A design engineer defines design blocks A–E prior to instantiation within circuit design 116'.

Figure 4:
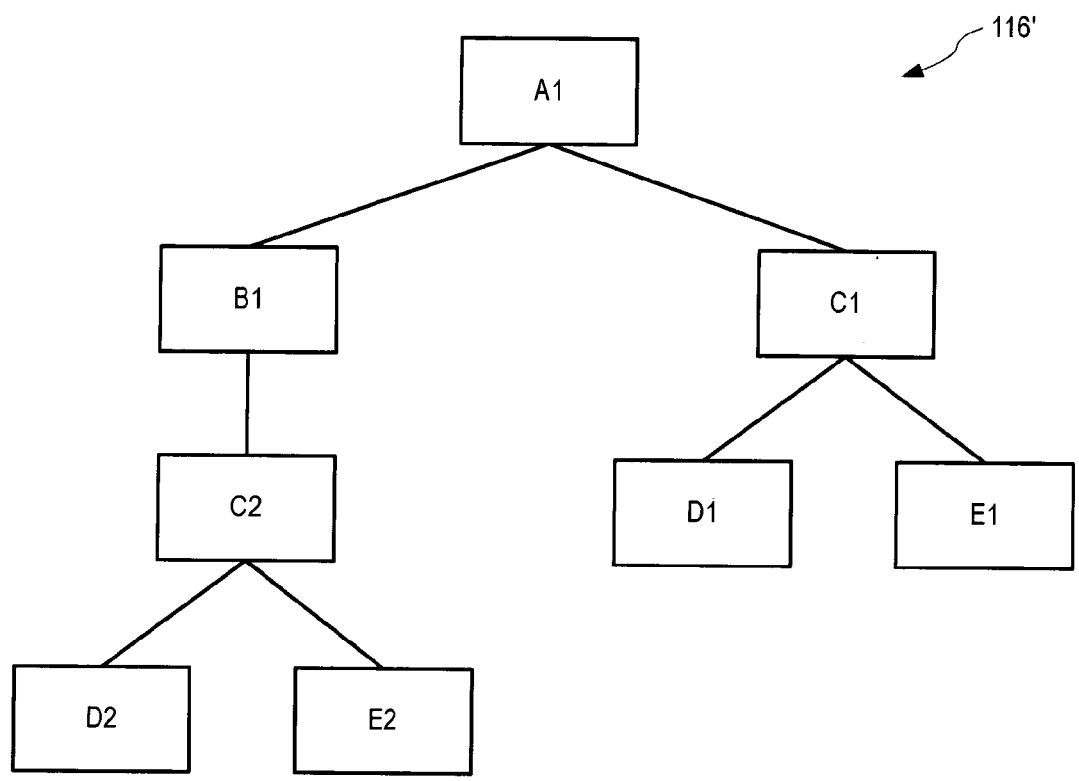
FIG. 4 illustrates exemplary hierarchical instances of the design blocks of FIG. 3.

FIG. 4 is a block diagram illustrating exemplary hierarchical instances of design blocks A, B, C, D and E of circuit design 116'. Design block A is the 'top level block' of circuit design 116', and is instantiated as block instance 'A1', indicating that it is the first instance of L lock A. As design block A includes design blocks B and C, design blocks B and C are instantiated as block instances B1 and C1, as shown. Design block B includes design block C; thus a second instantiation of design block C is identified as block instance C2. Design block C includes design blocks D and E; a first instantiation of design blocks D and E is thus shown as block instances D1 and E1 associated with block instance C1; second instantiations of design blocks D and E are shown as block instances D2 and E2 associated with block instance C2. Accordingly, circuit design 116' has five design blocks A, B, C, D and E, each instantiated one or more times, and totaling eight instantiations Al, B1, C1, C2, D1, D2, E1 and E2.

By way of illustrative operation, and with further reference to FIG. 2, the design engineer instructs analysis tool 120 to perform circuit analysis on one or more selected blocks (A–E) of circuit design 116'. In this way, the design engineer can analyze entire circuit design 116' or only selected blocks of circuit design 116'. In one example, the design engineer instructs analysis tool 120 to determine power requirements of circuit design 116'. Analysis tool 120 may, for example, determine switching power requirements of all HLSN signal nets of circuit design 116', hierarchically following the HLSN signal nets through selected blocks of circuit design 116'.

Figure 5:
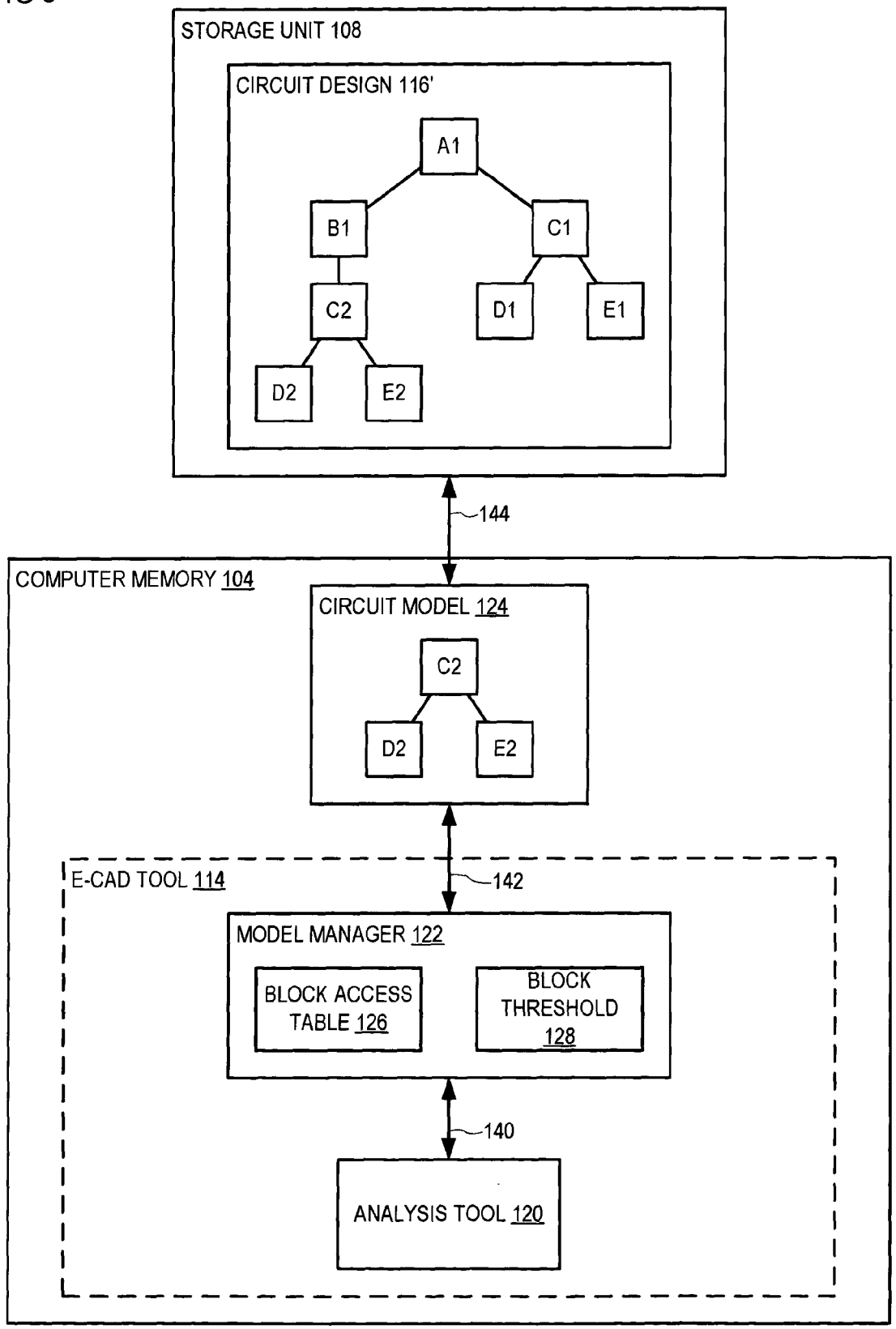
FIG. 5 illustrates exemplary data flow during analysis of a circuit design by a computer aided design system with reduced memory utilization.

FIG. 5 is a block diagram illustrating exemplary data flow with reduced memory utilization during analysis of circuit design 116' by analysis tool 120. In this example, storage unit 108 is shown loaded with circuit design 116' of FIG. 4, and computer memory 104 is shown loaded E-CAD tool 114 and circuit model 124. E-CAD tool 114 includes model manager 122 and analysis tool 120. Model manager 122 has a block access table 126 to record access to blocks within circuit model 124, and a block threshold 128 that predefines a maximum number of blocks to be concurrently loaded in circuit model 124. Block threshold 128 therefore sets a predefined maximum utilization of computer memory 104; it may be set, for example, by a design engineer through user interface 110, FIG. 2. Model manager 122 manages circuit model 124 such that one or more portions of circuit design 116' are accessible by analysis tool 120; such portions are made accessible to analysis tool 122 by loading appropriate design blocks from storage unit 108 to computer memory 104. In the example shown in FIG. 5, analysis tool 120 has access to block instances C2, D2 and E2 of circuit model 124. Block access table 126 thus tracks access to blocks C2, D2 and E2 of circuit model 124 by analysis tool 120. Model manager 122 also uses information of block access table 126 to determine which blocks to unload from circuit model 124 to storage unit 108.

In one embodiment, for each detected access to each block within circuit model 124, the time of the access to each block (e.g., a timestamp) is stored in block access table 126; block access table 126 thereby records the time of the most recent access to each block in circuit model 124. In another embodiment, for each block loaded into circuit model 124, a timestamp is stored in block access table 126, indicating the block load time, and, for each detected access to blocks within circuit model 124, an associated count in block access table 126 is incremented; block access table 126 thereby stores the frequency of access to the block since the block was loaded into circuit model 126. Those of ordinary skill in the art appreciate that alternate information may be stored in block access table 126 without departing from the scope hereof.

To further illustrate management of circuit model 124 by model manager 122, FIG. 6 shows three chronologically sequenced snapshots (124(A), 124(B), 124(C)) of circuit model 124. In circuit model 124A, block instances C2, D2 and E2 are shown within circuit model 124 and available for access by analysis tool 120. Model manager 122 then determines that analysis tool 120 requires access to block instance B1. As model manager 122 has already loaded a maximum number of block into circuit design 124, in this example, model manager 122 utilizes block access table 126 to determine that block D2 was the least recently accessed block within circuit model 124 and should therefore be removed prior to loading block B1. Circuit model 124B thus shows block D2 removed from circuit model 124. Circuit model 124C similarly illustrates a third situation after model manager 122 loads block B1 from circuit design 116' into circuit model 124.

Model manager 122 may use any one or more known techniques to identify one or more blocks to be removed from circuit model 124. For example, least recently used ("LRU") and least frequently used ("LFU") methods may be used by model manager 122 to identify the blocks to be removed from memory 104. In one example, model manager 122 caches blocks of circuit design 116 in circuit model 124 such that analysis tool 120 is unaware of the reduced memory utilization.

Figure 7:
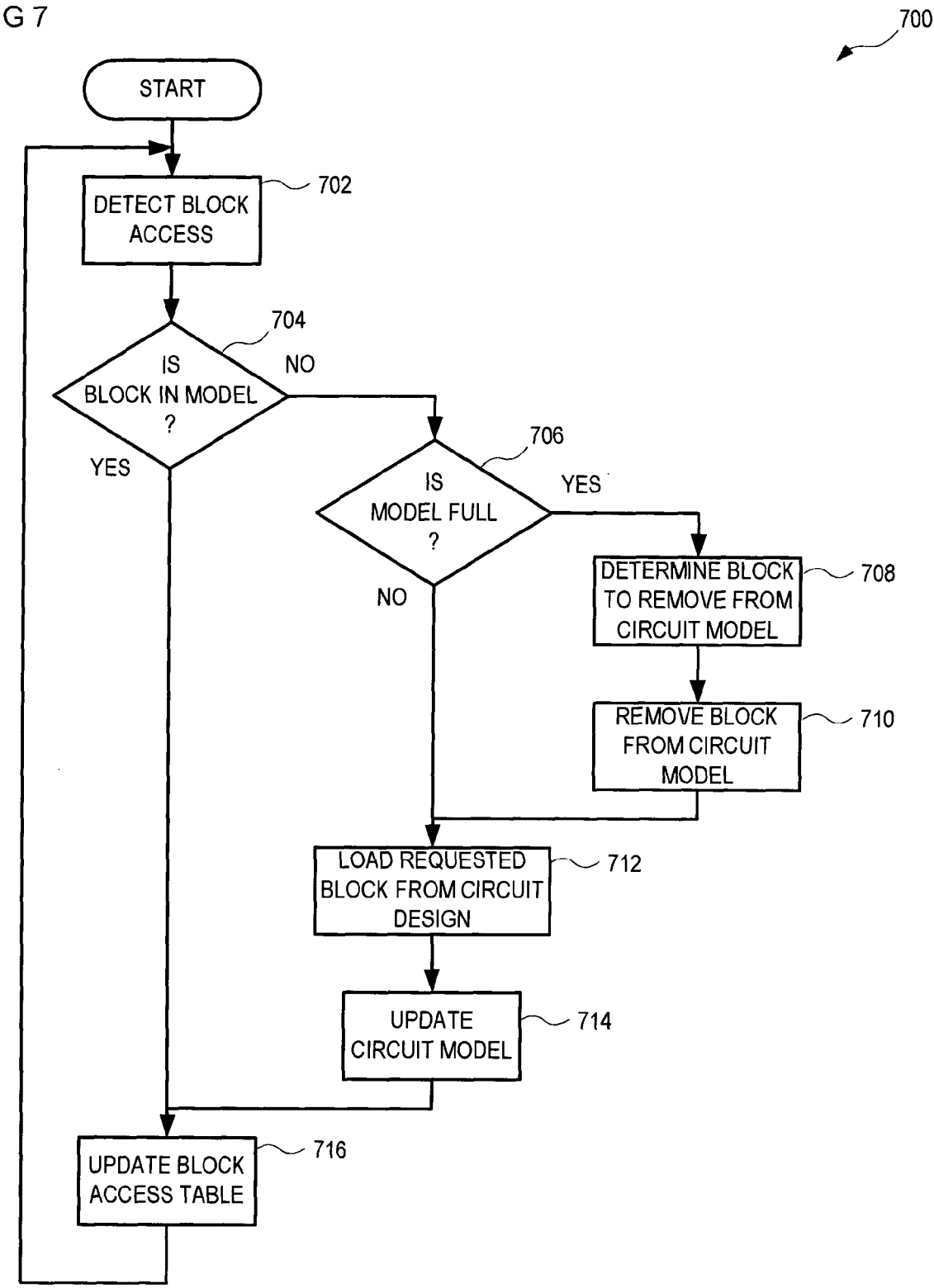
FIG. 7 is a flowchart illustrating one process for updating a circuit model to reduce memory utilization.

FIG. 7 is a flowchart illustrating one process 700 for reducing memory utilization in analyzing a circuit design. In one example, process 700 is implemented by model manager 122, FIG. 2. In step 702, process 700 detects block access by analysis tool 120. For example, in step 702, process 700 detects access to a block (e.g., block C2) loaded within circuit model 124 or a request to access a block (e.g., block B1) not loaded into circuit model 124. Step 704 is a decision. If the access is to a block already loaded in circuit model 124, process 700 continues with step 716; otherwise, process 700 continues with step 706. Step 706 is a condition. If circuit model 124 contains the maximum amount of blocks, as defined by block threshold 128, process 700 continues with step 708; otherwise, process 700 continues with step 712. In step 708, process 700 determines which block of circuit model 124 to remove in order to load, within circuit model 124, the block identified in step 702. For example, in step 708, model manager utilizes block access table 126 when implementing caching techniques to identify the LRU block or LFU block within circuit model 124. In step 710, the block identified in step 708 is removed, increasing available memory 104 by creating space within circuit model 124. In step 712, the block identified in step 702 is loaded from circuit design 116 into circuit model 124. In step 714, circuit model 124 is updated such that the block loaded in step 712 is integrated with other blocks within circuit model 124. In step 716, access to the blocks identified in steps 702 and 710 are recorded in block access table 126.

Those skilled in the art appreciate that process 700 may operate with similar function with reordered or modified steps without departing from the scope hereof.

Figure 8:
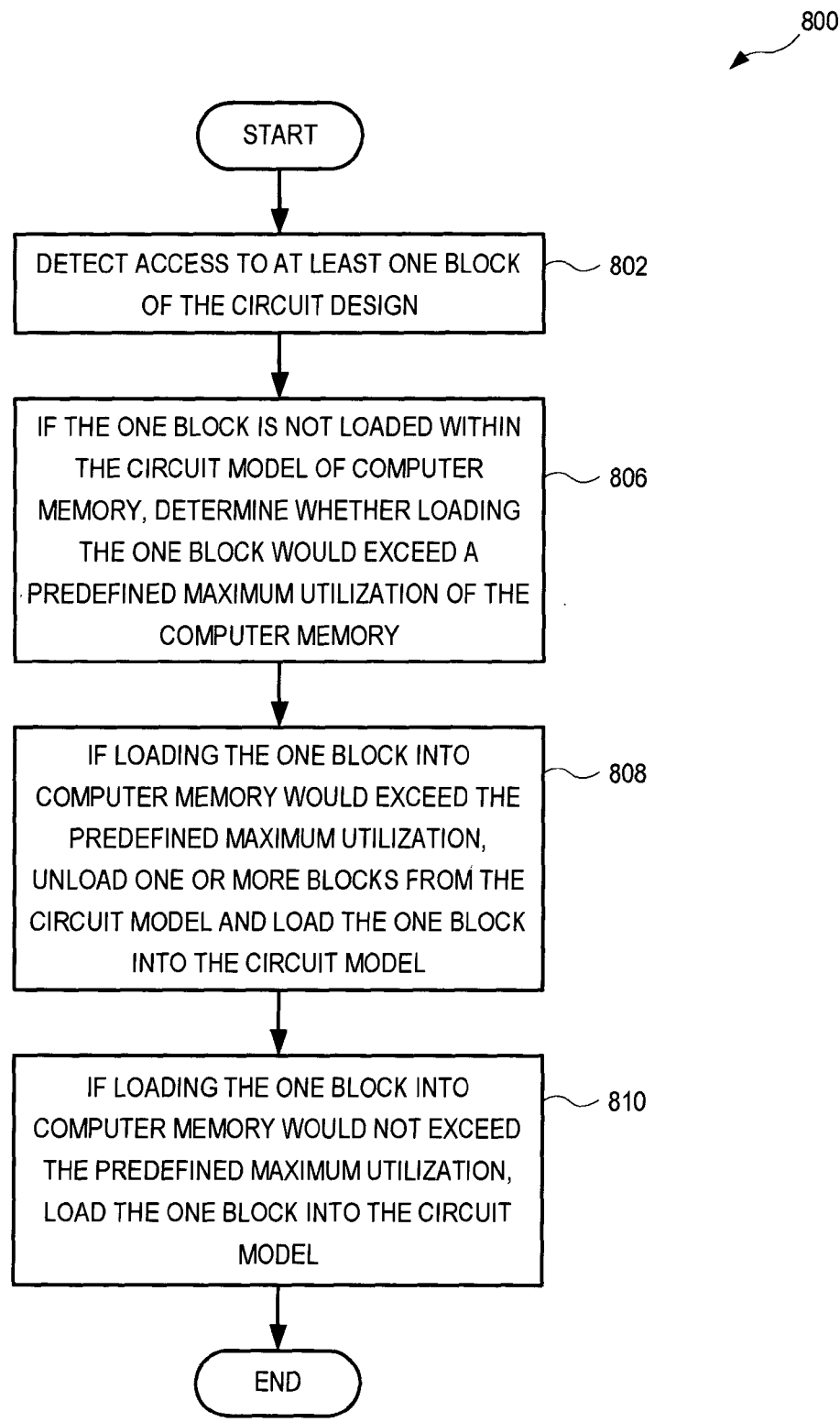
FIG. 8 shows one method for analyzing a circuit design with reduced memory utilization.

FIG. 8 is a flowchart illustrating one process 800 for analyzing a circuit design with reduced memory utilization. In step 802, process 800 detects access to at least one block of the circuit design. In step 806, if the one block is not loaded within the circuit model, process 800 determines whether loading the one block would exceed a predefined maximum utilization of the computer memory. In step 808, if loading the one block into computer memory would exceed the predefined maximum utilization, process 800 unloads one or more blocks from the circuit model and loads the one block into the circuit model. In step 810, if loading the one block into computer memory would not exceed the predefined maximum utilization, process 800 loads the one block into the circuit model.

Upon reading and fully comprehending the above disclosure, one of ordinary skill in the art appreciates that by partially loading circuit design 116 into memory, E-CAD tool 114 operates with reduced memory utilization. This allows circuit designs larger than available memory to be developed and to utilize unused memory for other purposes.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

FIG 3
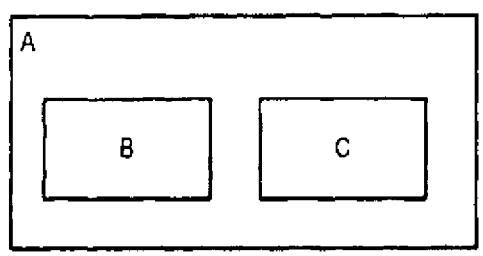
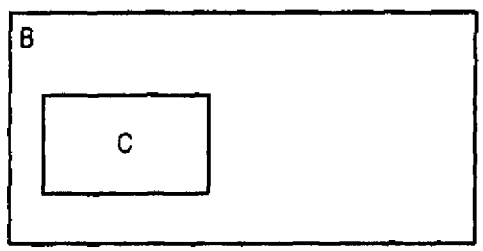
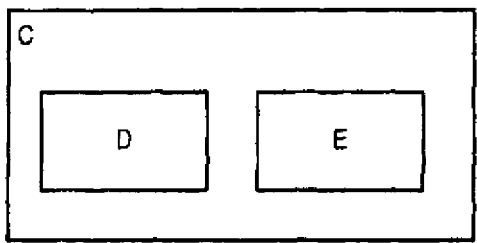

What is claimed is:

1. A method for analyzing a circuit design, comprising:
   detecting access to at least one block of the circuit design;
   if the one block is not loaded within a circuit model of computer memory, determining whether loading the one block into the circuit model would exceed a predefined maximum utilization of the computer memory;
   if loading the one block into the circuit model would exceed the predefined maximum utilization, unloading one or more blocks from the circuit model and loading the one block into the circuit model;
   if loading the one block into the circuit model would not exceed the predefined maximum utilization, loading the one block into the circuit model.

2. The method of claim 1, further comprising updating a block access table to record the access to the one block, if the one block is loaded within the circuit model;
   wherein the steps of updating and loading comprise recording the access to the block in the block access table; and
   wherein the step of unloading comprises utilizing the block access table to determine which blocks to unload from the circuit model.

3. The method of claim 2, the step of unloading further comprising utilizing an LRU caching technique with information of the block access table to determine which blocks to unload.

4. The method of claim 2, the step of unloading further comprising utilizing an LFU caching technique with information of the block access table to determine which blocks to unload.

5. A system for analyzing a circuit design, comprising:
   computer memory for storing a circuit model of the circuit design;
   an analysis tool for analyzing the circuit design by accessing one or more blocks of the circuit model; and
   a model manager for (a) loading one or more blocks of the circuit design to the circuit model and (b) unloading one or more blocks from the circuit model such that the circuit model does not exceed a predefined maximum utilization of the computer memory.

6. The system of claim 5, further comprising a storage unit for storing the circuit design.

7. The system of claim 5, further comprising a block access table for recording access to blocks of the circuit model by the analysis tool.

8. The system of claim 7, the model manager being operable to determine which blocks to remove from the circuit model by utilizing information of the block access table.

9. The system of claim 8, the model manager employing an LRU caching technique with information of the block access table to determine which blocks to remove from the circuit model.

10. The system of claim 8, the model manager employing an LFU caching technique with information of the block access table to determine which blocks to remove from the circuit model.

11. A system for analyzing a circuit design, comprising:
    means for detecting access to at least one block of the circuit design;
    means for determining whether loading the one block into a circuit model, stored within computer memory, would exceed a predefined maximum utilization of the computer memory when the one block is not currently within the circuit model;
    means for unloading one or more blocks from the circuit model and loading the one block into the circuit model when loading the one block into computer memory would exceed the predefined maximum utilization; and
    means for loading the one block into the circuit model when loading the one block into the computer model would not exceed the predefined maximum utilization.

12. The system of claim 11, further comprising means for recording the block access.

13. The system of claim 12, wherein the means for recording records the block access in a block access table.

14. The system of claim 13, further comprising means for utilizing the block access table to determine which blocks to unload from the circuit model.

15. The system of claim 14, the means for utilizing further comprising means for utilizing an LRU caching technique to determine which blocks to unload from the circuit model.

16. The system of claim 14, the means for utilizing further comprising means for utilizing an LFU caching technique to determine which blocks to unload from the circuit model.

17. A software product comprising instructions, stored on computer-readable media, wherein the instructions, when executed by a computer, perform steps for analyzing a circuit design with reduced memory utilization, comprising:
    instructions for detecting access to at least one block of the circuit design;
    instructions for recording the access when the one block is loaded within a circuit model of computer memory;
    instructions for determining whether loading the one block into the circuit model would exceed a predefined maximum utilization of the computer memory, when the one block is not loaded within the circuit model;
    instructions for unloading one or more blocks from the circuit model and loading the one block into the circuit model, when loading the one block into the circuit model would exceed the predefined maximum utilization; and
    instructions for loading the one block into the circuit model, when loading the one block into the circuit model would not exceed the predefined maximum utilization.

18. The software product of claim 17, further comprising instructions for recording the access in a block access table.

19. The software product of claim 18, further comprising instructions for utilizing the block access table to determine which blocks to unload.

20. The software product of claim 19, further comprising instructions for utilizing an LRU caching technique to determine which blocks to unload.

21. The software product of claim 19, further comprising instructions for utilizing an LFU caching technique to determine which blocks to unload.

22. The software product of claim 17, further comprising instructions for setting the predefined maximum utilization.

* * * * *

UNITED STATES PATENT AND TRADEMARK OFFICE
CERTIFICATE OF CORRECTION

PATENT NO. : 7,062,727 B2
APPLICATION NO. : 10/647598
DATED : June 13, 2006
INVENTOR(S) : S. Brandon Keller et al.

It is certified that error appears in the above-identified patent and that said Letters Patent is hereby corrected as shown below:

Delete sheet 3 of 8 and insert the attached sheet 3 of 8.

(On sheet 3 of 8, in Fig 3, line 1, insert --  --.)

In column 3, line 52, delete "eternal" and insert -- external --, therefor.

Signed and Sealed this

Seventeenth Day of March, 2009

JOHN DOLL
*Acting Director of the United States Patent and Trademark Office*